(12) United States Patent  (10) Patent No.: US 7,391,495 B2
Miyajima et al.  (45) Date of Patent: Jun. 24, 2008

(54) STAGE APPARATUS, EXPOSURE SYSTEM USING THE SAME, AND DEVICE MANUFACTURING METHOD

(75) Inventors: Yoshikazu Miyajima, Tochigi (JP); Yasuhito Sasaki, Tochigi (JP); Hitoshi Sato, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 14 days.

(21) Appl. No.: 10/820,120

(22) Filed: Apr. 8, 2004

(65) Prior Publication Data

US 2004/0223133 A1 Nov. 11, 2004

(30) Foreign Application Priority Data

May 6, 2003 (JP) ............................. 2003-128183

(51) Int. Cl.
*G03B 27/52* (2006.01)
*G03B 27/42* (2006.01)

(52) U.S. Cl. ............................. 355/30; 355/53; 355/72; 355/75

(58) Field of Classification Search .................. 355/72, 355/75, 53, 30; 310/10–12; 318/687
See application file for complete search history.

(56) References Cited

U.S. PATENT DOCUMENTS

| 6,226,073 | B1 | 5/2001 | Emoto ........................ 355/53 |
| 6,266,133 | B1 | 7/2001 | Miyajima et al. ............. 355/72 |
| 6,313,550 | B1 * | 11/2001 | Binnard et al. ................ 310/12 |
| 6,320,649 | B1 | 11/2001 | Miyajima et al. ............. 355/72 |
| 6,552,773 | B2 | 4/2003 | Emoto ........................ 355/53 |
| 6,583,859 | B2 | 6/2003 | Miyajima et al. ............. 355/72 |
| 6,721,035 | B1 * | 4/2004 | Segers et al. ................. 355/53 |
| 2001/0001248 | A1 * | 5/2001 | Emoto ........................ 355/53 |
| 2001/0055102 | A1 * | 12/2001 | Emoto ........................ 355/53 |
| 2002/0015139 | A1 * | 2/2002 | Hara ........................... 355/53 |
| 2003/0053037 | A1 * | 3/2003 | Blaesing-Bangert et al. .. 355/53 |
| 2003/0056815 | A1 * | 3/2003 | Sakai .......................... 134/153 |

* cited by examiner

*Primary Examiner*—Della J. Rutledge
(74) *Attorney, Agent, or Firm*—Fitzpatrick, Cella, Harper & Scinto

(57) ABSTRACT

A stage apparatus includes a base having a reference surface, a moving unit which moves along the reference surface, a static bearing which is provided in the moving unit and which supports the moving unit such that the moving unit can move along the reference surface, and a temperature controller which is provided in the moving unit and which controls the temperature of gas supplied to the static bearing. In the stage apparatus, air fluctuation in the measurement area of interferometers due to gas exhausted from the static bearing and/or distortion caused by heat transmitted to a retainer of a target is suppressed, and the stage positioning accuracy is thereby increased.

22 Claims, 8 Drawing Sheets

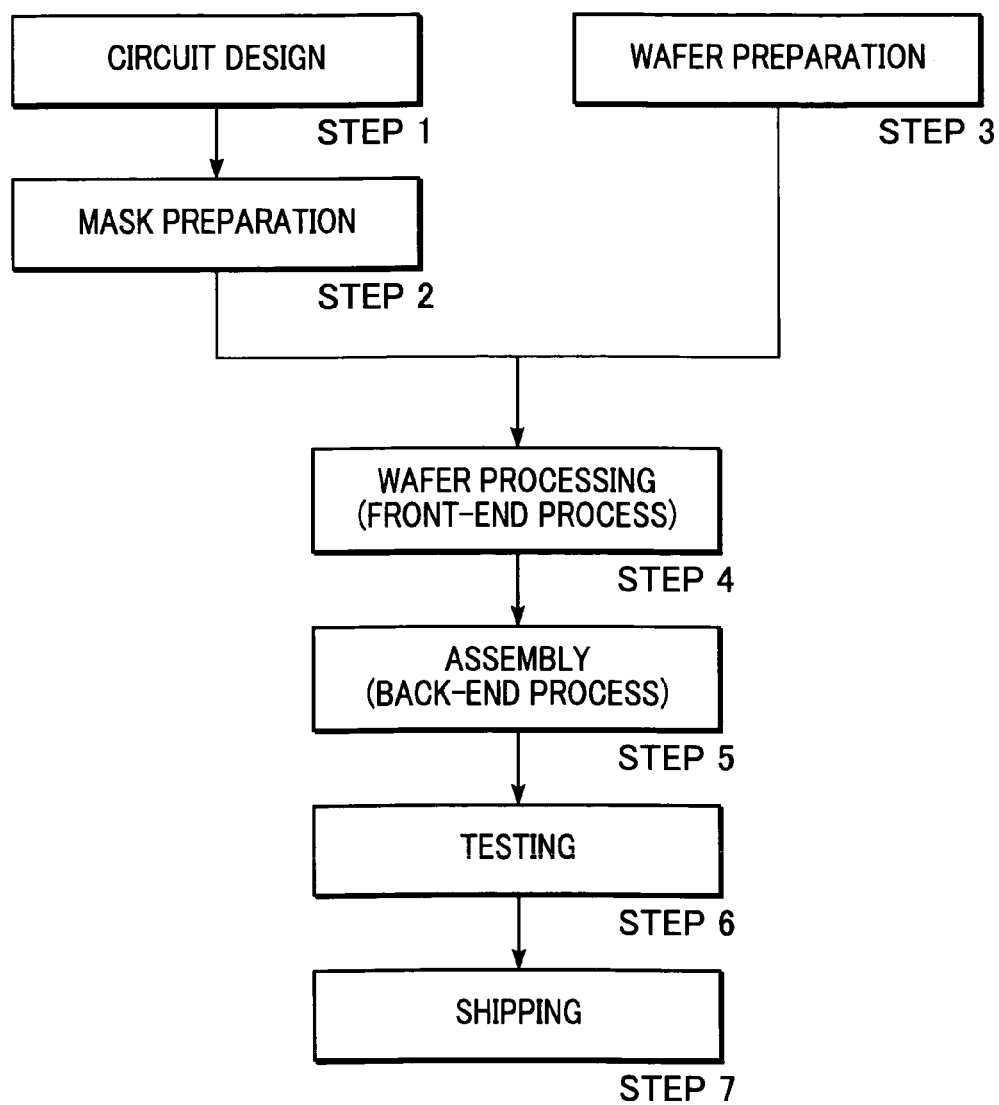

STAGE APPARATUS, EXPOSURE SYSTEM USING THE SAME, AND DEVICE MANUFACTURING METHOD

BACKGROUND OF THE INVENTION

1. Field of the Invention

The present invention relates to a stage apparatus used in precision equipment, such as semiconductor exposure systems, for moving and positioning a substrate, such as a semiconductor wafer and an original for exposure.

2. Description of the Related Art

In semiconductor manufacturing processes, projection exposure systems are used for projecting and transferring a pattern formed on a reticle substrate, which is an original, onto a silicon wafer, which is an exposure target. When the reticle pattern is projected onto the silicon wafer, the reticle and the silicon wafer are moved with respect to a projection exposure unit using stage apparatuses, such as a reticle stage and a wafer stage.

FIGS. 5 to 9 show the construction and the operation of a known projection exposure system. FIG. 5 is a schematic diagram showing the overall construction of the projection exposure system. With reference to FIG. 5, an illumination unit 1 irradiates a reticle (not shown) with exposure light emitted from an exposure light source (not shown) after the shape thereof is adjusted. The reticle, which is an original with an exposure pattern formed thereon, is placed on a reticle stage 2 and is moved with respect to a wafer 8 (see FIG. 6), which is an exposure target, at a predetermined reduction exposure ratio in a scanning process. A reduction projection lens 3 reduces and projects the original pattern formed on the reticle onto the wafer 8. A main unit 4 of the exposure system supports the reticle stage 2, the reduction projection lens 3, and a wafer stage 5. The wafer stage 5 moves the wafer 8 stepwise to different exposure locations, and also moves the wafer 8 in synchronization with the reticle in the scanning process.

With reference to FIG. 6, the wafer stage 5 includes a stage base 5D and a slider (moving unit) 5C. The wafer stage 5 has an illumination sensor 5A and a stage reference mark 5B on the top surface thereof (on the top surface of the slider 5C). The illumination sensor 5A is used for a calibration measurement of the illumination of the exposure light, which is performed before exposure in order to correct the amount of exposure light. The stage reference mark 5B includes a target for stage alignment measurement.

As shown in FIG. 7B, which is a sectional view of the wafer stage 5, the slider 5C has a surface-motor driver coil 5F, which is disposed in the slider 5C, and which drives the slider 5C along the top surface (reference surface) of the stage base 5D. An iron-core comb yoke 5E is provided on the stage base 5D such that the iron-core comb yoke 5E faces the surface-motor driver coil 5F, and the slider 5C is moved along a two-dimensional XY plane above the stage base 5D due to the interaction between a yoke, which is magnetized by the surface-motor driver coil 5F, and the iron-core comb yoke 5E.

FIG. 8 is a sectional view showing the detailed construction of the slider 5C. With reference to FIG. 8, an air bearing 5G, which is a static bearing, supports the slider 5C, such that the slider 5C can move along the XY plane, and supply air 5H is supplied to the air bearing 5G so that a static force can be generated. A six-axis fine motion stage 5N is mounted on top of the slider 5C to finely move the wafer 8 in X, Y, Z, $\theta x$, $\theta y$, and $\theta z$ directions, and positioning and focus/tilt adjustment of the wafer 8 are performed during exposure using the six-axis fine motion stage 5N. Heat 5J is emitted from the surface-motor driver coil 5F, and exhaust air 5K is discharged from the air bearing 5G. In addition, a temperature increase 5Q occurs due to the heat 5J emitted from the surface-motor driver coil 5F. As used here, the term "air" is intended to cover not only cleaned and dried atmospheric air, but also, inert gases, such as nitrogen gas and helium gas, and a mixture of inert gases and atmospheric air.

With reference to FIGS. 5 and 6 again, the focus scopes 6 are integrated with a lens barrel of the reduction projection lens 3 and are used for focus measurement of the wafer 8. An alignment scope 6A detects an alignment mark (not shown) formed on the wafer 8 and the stage reference mark 5B formed on the wafer stage, and performs measurements required for the alignment of each shot location in the wafer 8 and the alignment between the reticle and the wafer 8. A wafer conveyor robot 7 conveys the wafer 8 to the wafer stage 5. The wafer 8 is constructed by applying a resist onto a single-crystal silicon substrate, and the reticle pattern formed on the reticle is projected and transferred onto the wafer 8 through a reduction exposure unit, such as reduction projection lens 3 shown in FIG. 5.

A plurality of laser interferometers (not shown) are mounted on the slider 5C (see FIG. 6) for measuring the position of the slider 5C (hereafter, called the position of the wafer stage 5), that is, the position of the wafer 8. An X interferometer mirror 9 (see FIG. 6) serves as a target used by an X laser interferometer for measuring the position of the wafer stage 5 in the X direction, and a measurement beam 9A (see FIG. 7A) is emitted from the X laser interferometer. A Y interferometer mirror 10 serves as a target used by a Y laser interferometer for measuring the position of the wafer stage 5 in the Y direction, and a measurement beam 10A is emitted from the Y laser interferometer. Although the mirrors 9 and 10 are disposed outside the moving unit in FIG. 6, the construction may also be such that the mirrors are mounted on the moving unit so that lasers are externally directed onto them.

The inventors of the present invention have found that the stage positioning accuracy of the above-described known structure is below a level which can be expected, in view of the constructions of the position measurement unit and the stage driver unit, and that the accuracy can be improved. The inventors of the present invention have analyzed the cause of the degradation of control accuracy in the known structure and have found the facts described below.

That is, when the movement of the slider 5C is controlled, as shown in FIG. 9, in the exposure system shown in FIGS. 5 to 8, a drive current is applied to the surface-motor driver coil 5F (see FIG. 8), and the temperature of the slider 5C increases accordingly. When the temperature of the slider 5C increases, the temperature of the air 5H, which flows through the air supply unit of the air bearing 5G, also increases. Therefore, the temperature of the exhaust air 5K and that of the air surrounding the slider 5C increase. As a result, air fluctuation occurs, which adversely affects the measurement beam 9A from the X laser interferometer and the measurement beam 10A from the Y laser interferometer (each shown in FIG. 7A), causing measurement errors.

In addition, when the temperature of the slider 5C increases, heat is transmitted to the six-axis fine motion stage 5N mounted on top of the slider 5C, and the temperature increase 5Q occurs in the six-axis fine motion stage 5N. Accordingly, thermal distortion of the six-axis fine motion stage 5N and a wafer support, which supports the wafer 8, occurs.

As a result, when the slider 5C is moved to a desired position on the basis of measurement values obtained by the laser interferometers, the slider 5C cannot be accurately positioned at the desired position, and the control accuracy of the stage apparatus is degraded. In addition, the wafer flatness is reduced and the focusing accuracy is degraded accordingly. Thus, the overall performance of the exposure system is degraded.

SUMMARY OF THE INVENTION

The present invention solves at least one of the above-described problems of the known structure, that is, (a) the temperature increase in the air supplied to the air bearing, which is provided in the slider, the temperature increase being caused by heat emitted from the surface-motor driver coil, and (b) the thermal distortion of the six-axis fine motion stage and the wafer support (retainer) caused by heat being transmitted from the surface-motor driver coil to the six-axis fine motion stage mounted on the surface-motor slider.

More specifically, an object of the present invention is to improve the stage positioning accuracy by preventing the air fluctuation in the measurement area of the interferometers caused by the temperature increase in the air supplied to the air bearing provided in the slider and/or the thermal distortion of the six-axis fine motion stage and the wafer support.

In order to solve the above-described object, according to the present invention, a stage apparatus, which positions a target includes a base having a reference surface; a moving unit on which the target is mounted and which moves along the reference surface; a static bearing, which is provided in the moving unit and which supports the moving unit such that the moving unit can move along the reference surface; and a temperature controller, which is provided in the moving unit and which controls the temperature of gas supplied to the static bearing.

Preferably, the stage apparatus according to the present invention further includes a coil, which is provided in the moving unit and which drives the moving unit along the reference surface and a retainer which retains the target. The temperature controller is disposed between the coil and the target.

In addition, preferably, the stage apparatus further includes a supply pipe, which is disposed in the moving unit and through which the gas is supplied. The supply pipe is adjacent to the temperature controller. In addition, the temperature controller preferably uses a coolant for controlling the temperature, and a direction in which the coolant flows is preferably opposite to a direction in which the gas flows through the supply pipe.

In addition, at least a portion of the supply pipe is preferably surrounded by the temperature controller.

In addition, the moving unit preferably comprises a fine-motion driver, which drives the target in at least one direction. The temperature controller is preferably disposed between the coil and the fine-motion driver.

The object of the present invention can be effectively attained by the above-described constructions.

The stage apparatus of the present invention can be suitably used for positioning an original and/or a substrate in an exposure system, which transfers a pattern formed on the original onto the substrate.

Further objects, features and advantages of the present invention will become apparent from the following description of the preferred embodiments (with reference to the attached drawings).

BRIEF DESCRIPTION OF THE DRAWINGS

FIG. 10 is a flowchart of semiconductor manufacturing processes according to a fifth embodiment of the present invention.

DESCRIPTION OF THE PREFERRED EMBODIMENTS

Embodiments of the present invention will be described below.

First Embodiment

Figure 1:
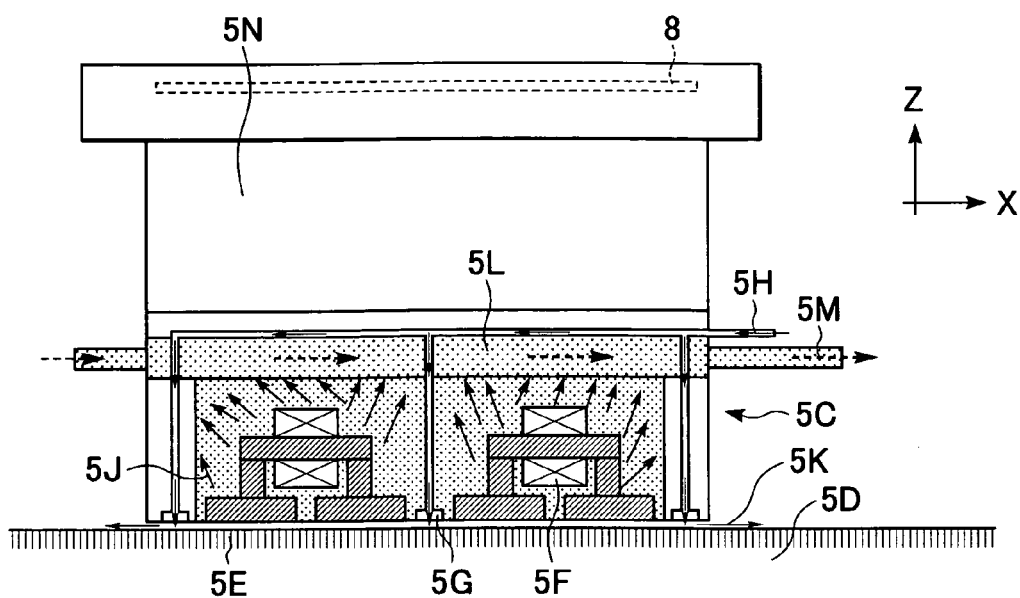
FIG. 1 is a diagram showing a surface-motor stage according to a first embodiment of the present invention.
Figure 7A:
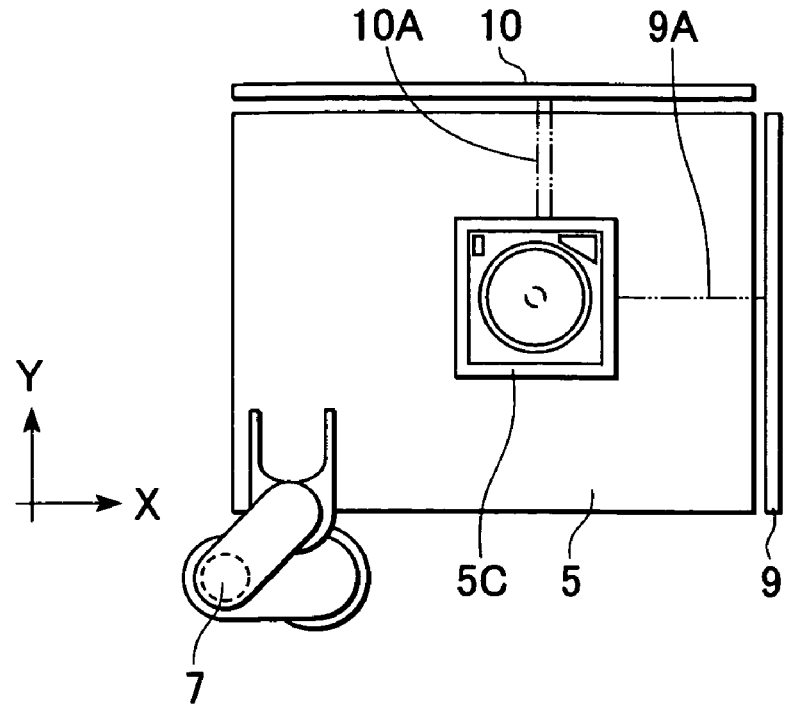
FIGS. 7A and 7B are diagrams showing the operation of the surface-motor stage included in the known exposure system shown in FIG. 5.
Figure 7B:
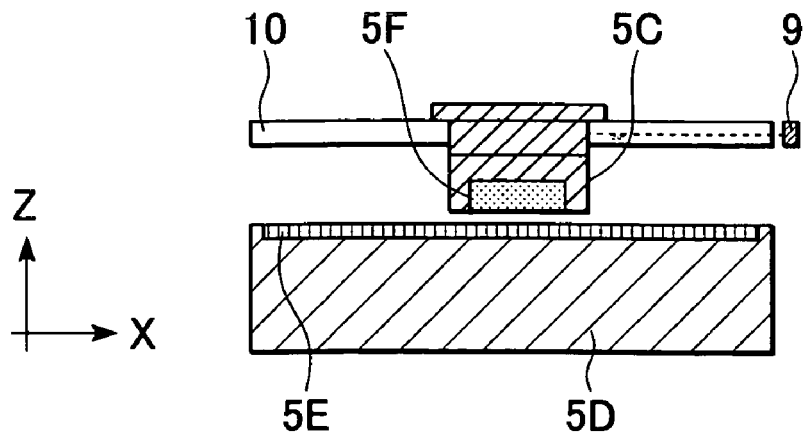
Figure 8:
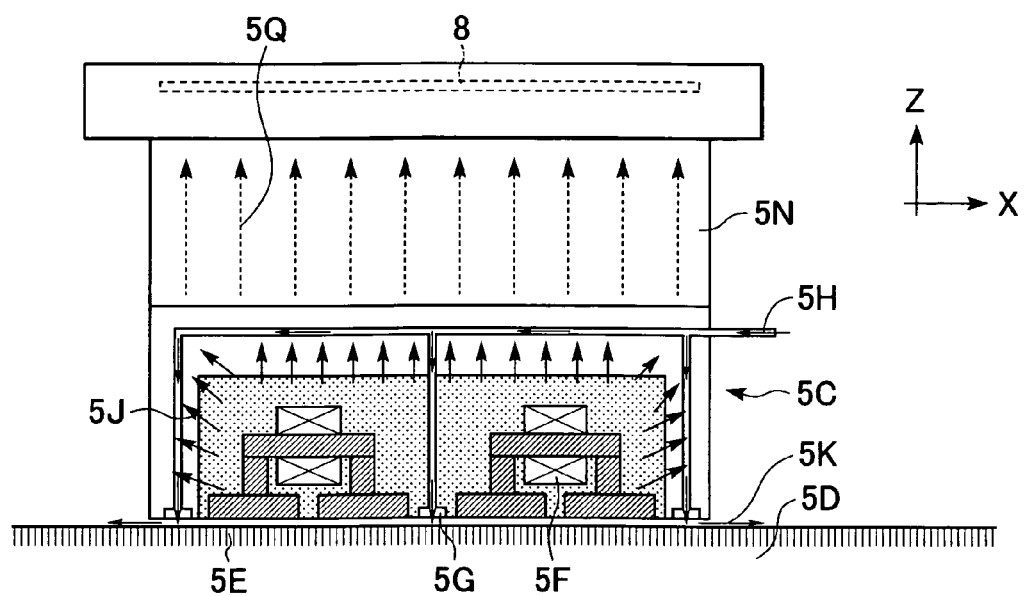
FIG. 8 is a sectional view showing the detailed construction of the surface-motor stage shown in FIGS. 7A and 7B.
Figure 9:
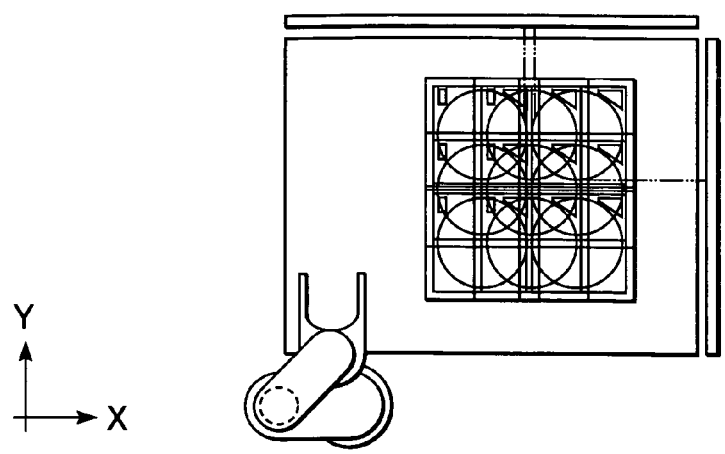
FIG. 9 is a diagram showing the moving area of the surface-motor stage shown in FIG. 8.

FIG. 1 shows the construction of a slider according to a first embodiment of the present invention. This slider is a component of an exposure system, similar to the known exposure system described above with reference to FIGS. 5 to 9, and is different from the slider shown in FIG. 8 in that a cooling unit 5L is provided as a temperature controller. Other constructions are similar to those in the slider shown in FIG. 8. Accordingly, components shown in FIG. 1, which are similar to those shown in FIG. 8, are denoted by the same reference numerals, and explanations thereof are thus omitted.

Figure 5:
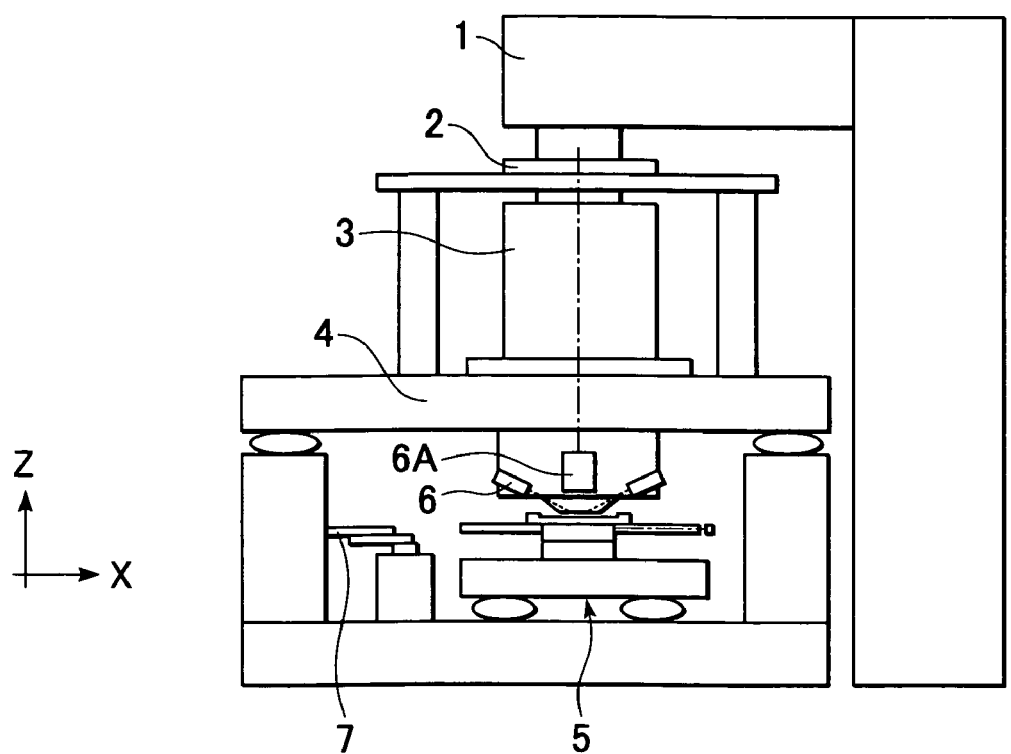
FIG. 5 is a diagram showing the overall construction of a known exposure system.
Figure 6:
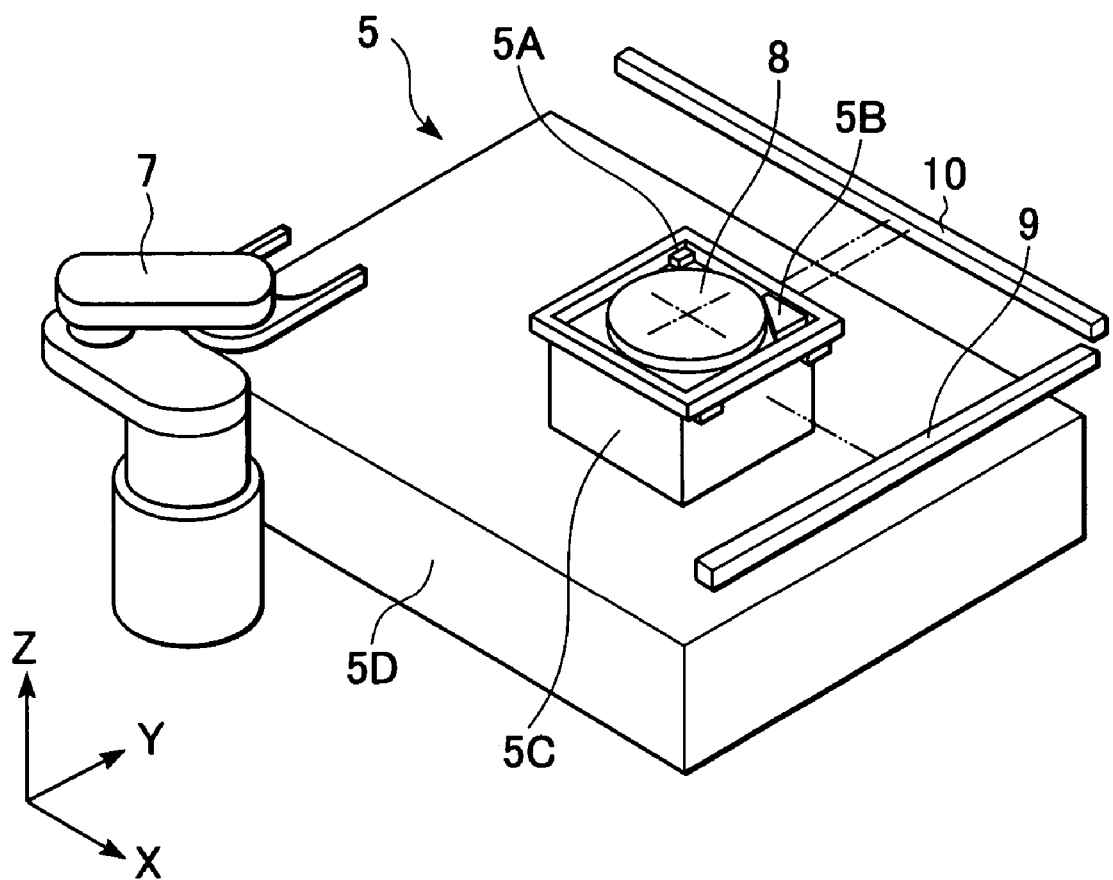
FIG. 6 is a perspective view of a surface-motor stage included in the known exposure system shown in FIG. 5.

In the construction shown in FIG. 1, the cooling unit 5L causes a coolant 5M to flow therethrough to absorb the heat 5J emitted from a surface-motor driver coil 5F. The coolant 5M may be, for example, water, pure water, inert fluorine, etc. When the movement of a slider 5C is controlled, a drive current is applied to the surface-motor driver coil 5F and the temperature of the slider 5C increases accordingly. When the temperature of the slider 5C increases, the temperature of the air 5H, which flows through the air supply unit of the air bearing 5G, also increases. In order to prevent this, the cooling unit 5L is provided adjacent to the air supply unit through which the air 5H is supplied, and the coolant 5M is caused to flow through the cooling unit 5L so as to absorb the heat 5J emitted from the surface-motor driver coil 5F. The cooling unit 5L may also be provided adjacent to the surface-motor driver coil 5F. In addition, the cooling unit 5L may be constructed of, for example, a cooling pipe. As a result, the temperature increase in the exhaust air 5K and in the air surrounding the slider 5C can be suppressed and temperature disturbance in that region can be prevented. Since the temperature disturbance, which causes the air fluctuation, is prevented, the measurement beam 9A from the X laser interferometer and the measurement beam 10A from the Y laser interferometer, which are shown in FIGS. 5 to 7, are not adversely affected. Therefore, the cause of measurement errors is eliminated. As a result, the measurement accuracy can be improved.

In addition, since the temperature increase in the slider 5C is suppressed by the cooling unit 5L, and heat is prevented from being transmitted to a six-axis fine motion stage 5N mounted on top of the slider 5C, thermal distortion of the six-axis fine motion stage 5N and the wafer support, which supports the wafer 8, can be suppressed. As a result, when the slider 5C is moved to a desired position on the basis of measurement values obtained by the laser interferometers, the slider 5C can be accurately positioned at the desired position, and the control accuracy of the stage apparatus is improved. In addition, the wafer flatness can be prevented from being reduced and the focusing accuracy can be improved. Thus, the overall performance of the exposure system can be improved.

Second Embodiment

Figure 2:
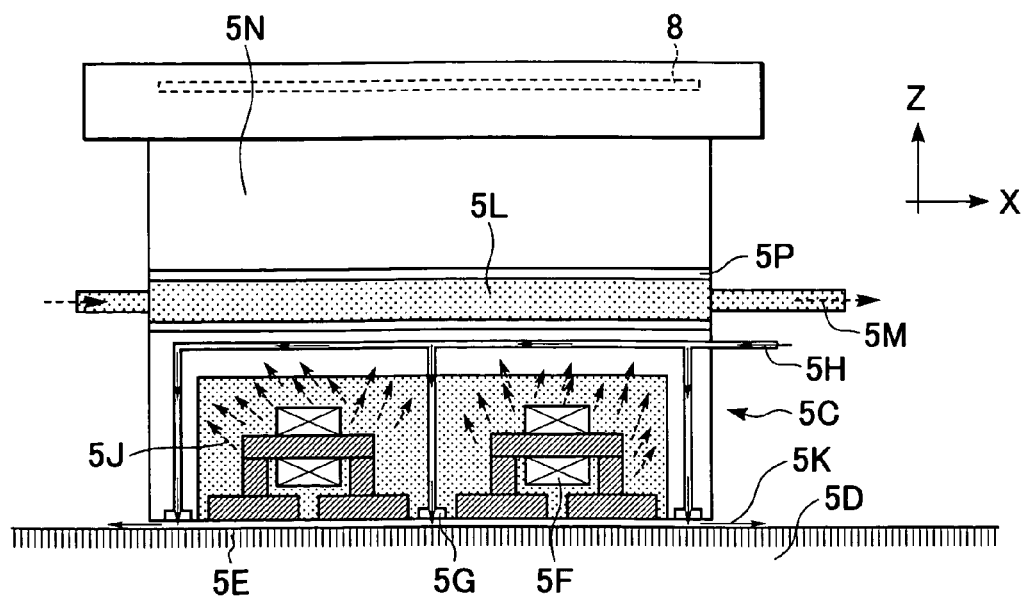
FIG. 2 is a diagram showing a surface-motor stage according to a second embodiment of the present invention.

FIG. 2 shows the construction of a slider according to a second embodiment of the present invention. In the first embodiment, the cooling unit 5L is provided adjacent to the surface-motor driver coil 5F. In the second embodiment, the cooling unit 5L is provided in a fine-motion base 5P, positioned between the six-axis fine motion stage 5N and the slider 5C, and which serves as a base of the six-axis fine motion stage 5N. As in this case, if the amount of heat emitted from the surface-motor driver coil 5F is small, the construction may also be such that the heat is only prevented from being transmitted to the six-axis fine motion stage 5N. Also, in this case, the measurement and driving accuracy, and the control accuracy of the six-axis fine motion stage 5N, can be improved, as compared to the known construction.

Third Embodiment

Figure 3:
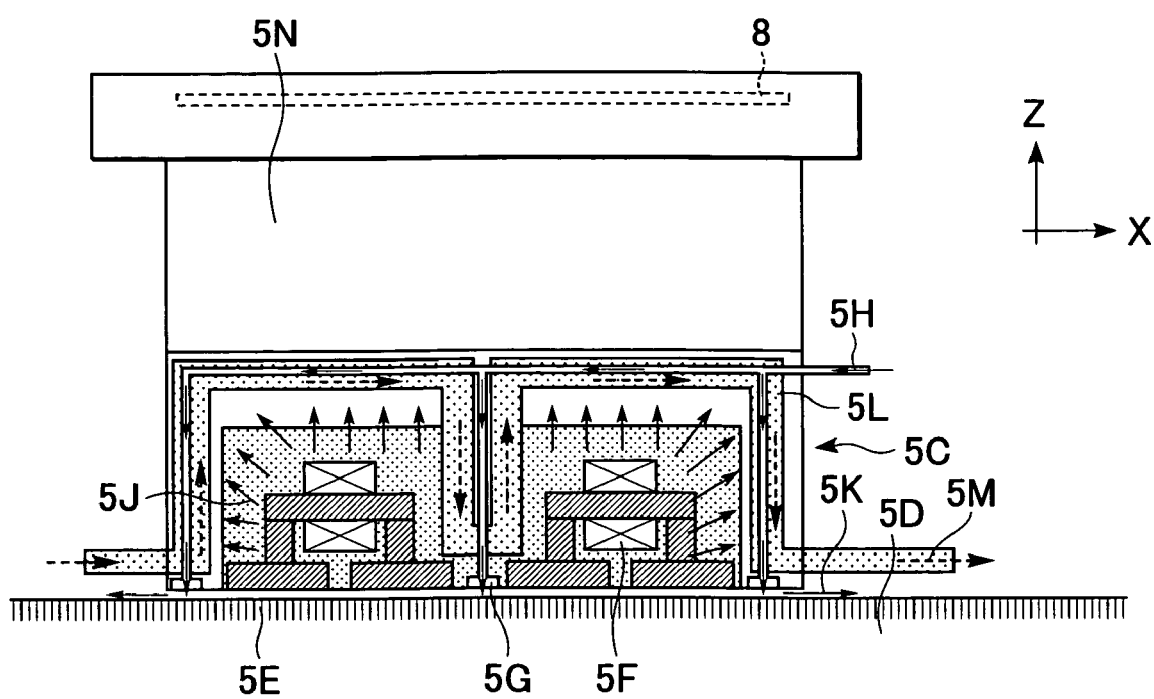
FIG. 3 is a diagram showing a surface-motor stage according to a third embodiment of the present invention.

FIG. 3 shows the construction of a slider according to a third embodiment of the present invention. In the first embodiment, the cooling unit 5L is provided only on the top surface of the surface-motor driver coil 5F. However, if the amount of heat emitted from the surface-motor driver coil 5F is large, and the temperature must be controlled under severe conditions, the cooling unit 5L may be provided so as to cover the outer periphery of the surface-motor driver coil 5F, as shown in FIG. 3, and a supply pipe through which the air 5H is supplied may be arranged such that it extends along the outer periphery of the cooling unit 5L. In this case, the air 5H can be supplied to the air bearing 5G without being affected by the heat 5J being emitted from the surface-motor driver coil 5F.

Fourth Embodiment

Figure 4A:
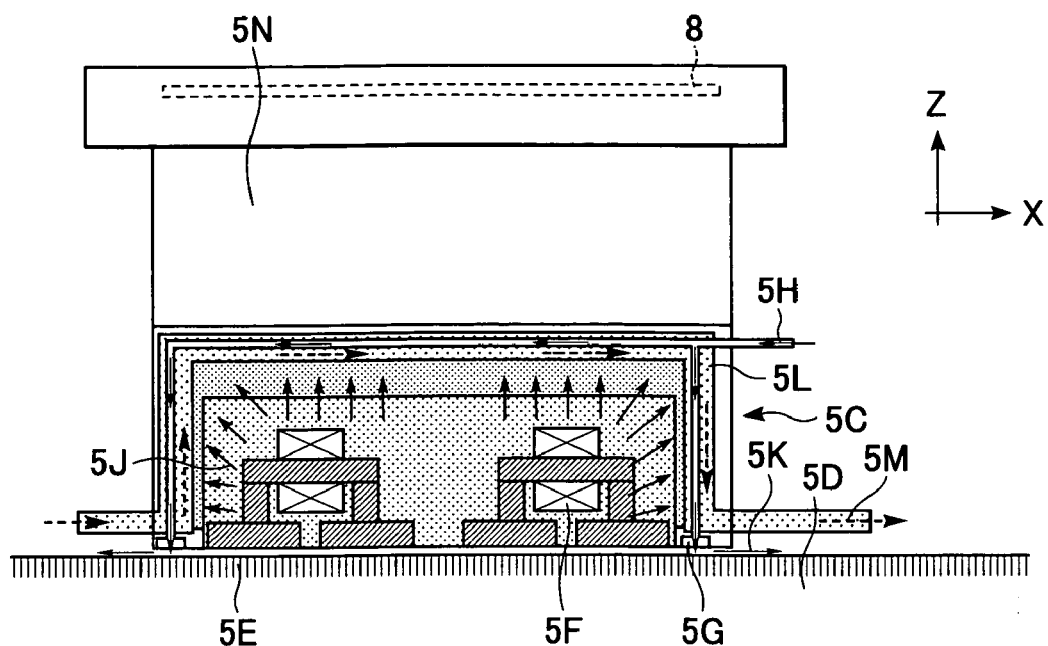
FIGS. 4A and 4B are diagrams showing a surface-motor stage according to a fourth embodiment of the present invention.
Figure 4B:
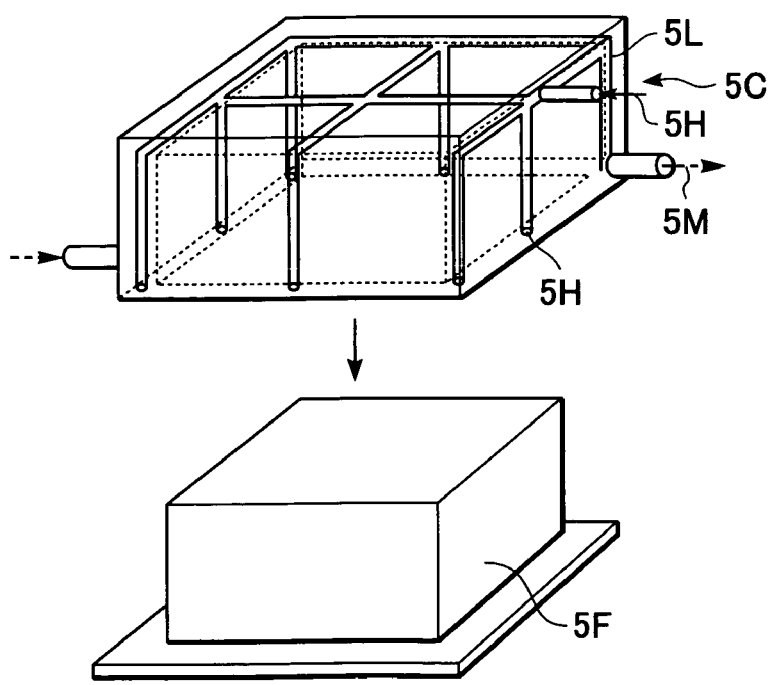

FIGS. 4A and 4B show the construction of a slider according to a fourth embodiment of the present invention. When the outer periphery of the surface-motor driver coil 5F is covered with the slider 5C, as shown in FIGS. 4A and 4B, the cooling unit 5L can be provided in or on the surface of the slider 5C itself. In such a case, the entire region of the slider 5C can be cooled.

According to the above-described embodiments, the cooling unit 5L is provided at the outer periphery of the surface-motor driver coil 5F disposed in the slider 5C of the surface motor stage. In addition, the supply pipe, through which the air is supplied to the air bearing 5G, which supports and moves the slider 5C along the XY plane, is arranged adjacent to or inside the cooling unit 5L. Therefore, the air can be supplied without being affected by the heat source in the slider 5C, and air fluctuation in the measurement area of the interferometers can be prevented from being caused by the exhaust air being discharged from the air bearing 5G. Accordingly, the stage positioning accuracy is improved. In addition, since the cooling unit 5L is disposed between the slider 5C of the surface motor stage and the six-axis fine motion stage to block the heat transmission from the surface-motor driver coil 5F to the six-axis fine motion stage, thermal distortion of the six-axis fine motion stage and the wafer support can be prevented.

The present invention is not limited to the above-described embodiments, and various modifications are possible. For example, the air, the temperature of which is to be controlled, may also be an inert gas, such as nitrogen gas and helium gas, or a mixture of inert gases and atmospheric air. In addition, the function of the cooling unit is not limited to cooling, and temperature control may also be performed by the cooling unit. In addition, although a wafer stage on which a wafer is mounted as a target is described in the above embodiments, the present invention may also be applied to a reticle stage on which a reticle is mounted. In addition, although the stage apparatuses according to the above embodiments are used in a step-and-scan exposure system, the present invention may also be applied to stage apparatuses used in other types of exposure systems, such as step-and-repeat exposure systems, semiconductor manufacturing systems other than exposure systems, and other precision equipment such as scanning electron microscopes.

Fifth Embodiment

Next, processes of manufacturing a semiconductor device using the above-described exposure system will be described below. FIG. 10 is a flowchart showing an overall flow of manufacturing processes for manufacturing the semiconductor device. In step 1 (circuit design), circuits for the semiconductor device are designed. In step 2 (mask preparation), a mask having the designed circuit pattern is manufactured.

In step 3 (wafer preparation), a wafer is manufactured from, for example, silicon. Step 4 (wafer processing) is known as a front-end process, and actual circuits are formed on the wafer by a lithographic technique using the above-described mask and the exposure system. Step 5 (assembly) is known as a back-end process, and semiconductor chips are formed by using the wafer processed in Step 4. Step 5 includes assembly processes (dicing and bonding), packaging processes (enclosing of the chips), etc. In Step 6 (testing), various tests including operation tests, durability tests, etc., of the semiconductor device obtained in Step 5 are performed. Accordingly, the semiconductor device is completed, and is then shipped in Step 7.

The above-described wafer process (Step 4) includes an oxidation sub-step of oxidizing the surface of the wafer; a chemical-vapor-deposition (CVD) sub-step of forming an insulating layer on the surface of the wafer; an electrode formation sub-step of forming electrodes on the wafer by vapor deposition; an ion implantation sub-step of implanting ions into the wafer; a resist processing sub-step of applying a photosensitive material on the wafer; an exposure sub-step of transferring the circuit pattern onto the wafer after the resist processing step using the above-described exposure system; a development sub-step of developing the wafer, which is exposed in the exposure sub-step; an etching sub-step of etching parts, which are not covered by the resist, which is developed in the development sub-step; and a resist removing sub-step of removing the resist, which is not necessary after the etching. By repeating the above-described sub-steps, the circuit pattern having multiple levels is formed.

Except as otherwise discussed herein, the various components shown in outline or in block form in the figures are individually well known and their internal construction and operation are not critical either to the making or using or to a description of the best mode of the invention.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A stage apparatus comprising:
    a base plate;
    a moving unit movable along a surface of said base plate;
    a linear motor which drives said moving unit and includes a coil unit in said moving unit;
    a gas bearing unit which supports said moving unit on said base plate; and
    a cooling unit which includes a cooling pipe provided in said moving unit through which a coolant flows to cool said coil unit, wherein said cooling unit is disposed between said coil unit and a substrate mounted on said moving unit,
    wherein (i) said cooling pipe provides coolant flow that cools a gas used by said gas bearing unit, (ii) said gas bearing unit has a supply pipe through which the gas flows, (iii) said supply pipe is not connected to said cooling pipe, and (iv) at least a portion of said supply pipe is disposed adjacent to or is surrounded by said cooling pipe.

2. The apparatus according to claim 1, wherein said cooling pipe is disposed near an outer periphery of said moving unit.

3. The apparatus according to claim 1, further comprising a laser interferometer for measuring a position of said moving unit.

4. The apparatus according to claim 1, wherein a direction in which the coolant flows in said cooling pipe is opposite to that in which the gas flows through said supply pipe.

5. The apparatus according to claim 1, wherein said moving unit comprises a fine-motion actuator which moves a substrate mounted on said moving unit, and said cooling pipe is disposed between said coil unit and said fine-motion actuator.

6. A stage apparatus according to claim 1, wherein said linear motor is a surface motor.

7. A stage apparatus comprising:
    a base plate;
    a first moving unit movable along a surface of said base plate;
    a linear motor which drives said first moving unit and includes a coil unit in said first moving unit;
    a second moving unit disposed above said first moving unit, which moves with respect to said first moving unit; and
    a cooling unit including a cooling pipe disposed between said first and second moving units, wherein a coolant flow through said cooling pipe absorbs a heat transmission from said coil unit to said second moving unit.

8. A stage apparatus according to claim 7, wherein said second moving unit moves within a range smaller than that of said first moving unit.

9. A stage apparatus according to claim 7, wherein said linear motor is a surface motor.

10. A stage apparatus comprising:
    a base plate;
    a moving unit movable along a surface of said base plate;
    a linear motor which drives said moving unit and includes a coil unit in said moving unit;
    a gas bearing unit which supports said moving unit on said base plate; and
    a cooling unit which includes a cooling pipe provided in said moving unit through which a coolant flows,
    wherein (i) said gas bearing unit has a supply pipe through which a gas flows, (ii) said cooling unit is provided between said coil unit and said supply pipe, and (iii) at least a portion of said supply pipe is disposed adjacent to or surrounded by said cooling pipe.

11. The apparatus according to claim 10, wherein said cooling unit is disposed near an outer periphery of said moving unit.

12. The apparatus according to claim 10, further comprising a laser interferometer for measuring a position of said moving unit.

13. The apparatus according to claim 10, wherein said cooling unit is disposed between said coil unit and a substrate mounted on said moving unit.

14. The apparatus according to claim 10, wherein a direction in which the coolant flows in said cooling pipe is opposite to that in which the gas flows through said supply pipe.

15. The apparatus according to claim 10, wherein said moving unit comprises a fine-motion actuator which moves a substrate mounted on said moving unit, and said cooling pipe is disposed between said coil unit and said fine-motion actuator.

16. A stage apparatus according to claim 10, wherein said linear motor is a surface motor.

17. A stage apparatus comprising:
    a base plate;
    a moving unit movable along a surface of said base plate;
    a linear motor which drives said moving unit and includes a coil unit in said moving unit;
    a gas bearing unit which supports said moving unit on said base plate; and
    a cooling unit which includes a cooling pipe provided in said moving unit through which a coolant flows to cool said coil unit,
    wherein (i) said cooling pipe provides coolant flow that cools a gas used by said gas bearing unit, (ii) said gas bearing unit has a supply pipe through which the gas flows, (iii) said supply pipe is not connected to said cooling pipe, (iv) at least a portion of said supply pipe is disposed adjacent to or is surrounded by said cooling pipe, and (v) said moving unit comprises a fine-motion actuator which moves a substrate mounted on said moving unit, and said cooling pipe is disposed between said coil unit and said fine-motion actuator.

18. The apparatus according to claim 17, wherein said cooling pipe is disposed near an outer periphery of said moving unit.

19. The apparatus according to claim 17, further comprising a laser interferometer for measuring a position of said moving unit.

20. The apparatus according to claim 17, wherein said cooling unit is disposed between said coil unit and a substrate mounted on said moving unit.

21. The apparatus according to claim 17, wherein a direction in which the coolant flows in said cooling pipe is opposite to that in which the gas flows through said supply pipe.

22. A stage apparatus according to claim 17, wherein said linear motor is a surface motor.

* * * * *